(12) United States Patent
Zamdmer

(10) Patent No.: US 9,047,990 B2
(45) Date of Patent: Jun. 2, 2015

(54) DETERMINATION OF SERIES RESISTANCE OF AN ARRAY OF CAPACITIVE ELEMENTS

(75) Inventor: Noah Zamdmer, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 905 days.

(21) Appl. No.: 13/269,830

(22) Filed: Oct. 10, 2011

(65) Prior Publication Data

US 2013/0088248 A1    Apr. 11, 2013

(51) Int. Cl.
    *H03K 3/03*            (2006.01)
    *G01R 27/08*         (2006.01)
    *G11C 29/50*         (2006.01)
    *H03L 7/099*         (2006.01)
    *G11C 11/40*         (2006.01)

(52) U.S. Cl.
CPC ........ *G11C 29/50016* (2013.01); *H03K 3/0315* (2013.01); *H03L 7/0995* (2013.01); *G11C 11/40* (2013.01); *G11C 2029/5002* (2013.01)

(58) Field of Classification Search
CPC ............................ H03K 3/0315; H03L 7/0995
See application file for complete search history.

(56) References Cited

U.S. PATENT DOCUMENTS

| | | | |
|---|---|---|---|
| 5,790,479 A * | 8/1998 | Conn ............................. 368/118 |
| 6,333,680 B1 * | 12/2001 | Smith et al. ..................... 331/57 |
| 6,600,680 B2 * | 7/2003 | Sell et al. ................. 365/189.09 |
| 6,724,214 B2 | 4/2004 | Manna et al. |
| 6,819,123 B2 * | 11/2004 | Marshall et al. .............. 324/711 |
| 6,833,725 B2 | 12/2004 | Ohkawa et al. |
| 7,069,525 B2 | 6/2006 | Bhushan et al. |
| 7,071,710 B2 * | 7/2006 | Marshall et al. .............. 324/677 |
| 7,190,233 B2 | 3/2007 | Bhushan et al. |
| 7,352,252 B2 | 4/2008 | Gonzalez et al. |
| 7,376,001 B2 * | 5/2008 | Joshi et al. ..................... 365/154 |
| 7,489,204 B2 * | 2/2009 | Habitz et al. .................... 331/44 |
| 7,490,304 B2 | 2/2009 | Mina et al. |
| 7,532,078 B2 * | 5/2009 | Agarwal et al. ................. 331/57 |
| 7,542,327 B2 * | 6/2009 | Zimmermann ............... 365/149 |
| 7,635,985 B2 * | 12/2009 | Park ............................. 324/691 |
| 7,659,126 B1 * | 2/2010 | Smith et al. ..................... 438/14 |
| 8,362,848 B2 * | 1/2013 | Raghunathan et al. ....... 331/186 |
| 2004/0100336 A1 * | 5/2004 | Christensen et al. ........... 331/57 |
| 2007/0013453 A1 * | 1/2007 | Jordy ............................. 331/57 |
| 2007/0153598 A1 * | 7/2007 | Zimmermann ............... 365/201 |
| 2008/0061894 A1 * | 3/2008 | Raita et al. ...................... 331/57 |
| 2008/0195337 A1 * | 8/2008 | Agarwal et al. ................. 702/75 |
| 2009/0161494 A1 | 6/2009 | Kwak |

(Continued)

OTHER PUBLICATIONS

Klein, et al.; IP.com No. IPCOM000049584D, "Array Cell Stability Monitor", Jun. 1, 1982; ip.com; pp. 1-3.

(Continued)

*Primary Examiner* — Patrick Assouad
*Assistant Examiner* — Hoang X Nguyen
(74) *Attorney, Agent, or Firm* — Cantor Colburn LLP; William Steinberg

(57) ABSTRACT

A circuit for determination of a resistance of an array of capacitive elements includes a reference ring oscillator circuit, the reference ring oscillator circuit being loaded with low-loss capacitive elements; an array test ring oscillator circuit, the array test ring oscillator circuit being loaded with the array of capacitive elements; and a resistance determination module, the resistance determination module configured to determine the resistance of the array of capacitive elements based on data from the reference ring oscillator circuit and the array test ring oscillator circuit.

19 Claims, 6 Drawing Sheets

(56) References Cited

U.S. PATENT DOCUMENTS

2010/0073982 A1    3/2010   Asayama et al.
2013/0088248 A1*   4/2013   Zamdmer .................... 324/705
2014/0340073 A1*  11/2014   Okamoto et al. .......... 324/76.39

OTHER PUBLICATIONS

IBM, IP.com No. IPCOM000193110D, "Ring Oscillator Circuit and Method for Isolating Resistance and Capacitance Effects," Feb. 10, 2010; pp. 1-4.

\* cited by examiner

DETERMINATION OF SERIES RESISTANCE OF AN ARRAY OF CAPACITIVE ELEMENTS

BACKGROUND

This disclosure relates generally to the field of circuitry for determination of the resistance of an array of capacitive elements.

A computer memory, such as dynamic random access memory (DRAM), may include an array of capacitive memory elements. The capacitive memory elements may be deep trench capacitors, and the array of capacitive memory elements may be connected by a single interconnect level. The total series resistance of the array of capacitive memory elements should be reduced in order to reduce the amount of time necessary for read and write operations in the computer memory. However, the resistance of an array of capacitive elements is difficult to measure because the resistance of the capacitive elements is in series with the capacitive elements' capacitance. The resistance of an array of capacitive elements may only be observable using measurements at frequencies near the bandwidth of the capacitive elements, which may be about 1 gigahertz. Such measurements require equipment that may not be available on an in-line parametric tester, such as a 10 gigahertz network analyzer, and may require more than one interconnect level to reduce parasitic capacitance.

BRIEF SUMMARY

In one aspect, a circuit for determination of a resistance of an array of capacitive elements includes a reference ring oscillator circuit, the reference ring oscillator circuit being loaded with low-loss capacitive elements; an array test ring oscillator circuit, the array test ring oscillator circuit being loaded with the array of capacitive elements; and a resistance determination module, the resistance determination module configured to determine the resistance of the array of capacitive elements based on data from the reference ring oscillator circuit and the array test ring oscillator circuit.

In another aspect, a method for determination of a resistance of an array of capacitive elements includes determining a direct current (DC) current in a reference ring oscillator circuit, the reference ring oscillator circuit being loaded with low-loss capacitive elements; determining a DC current in an array test ring oscillator circuit, the array test ring oscillator circuit being loaded with the array of capacitive elements; determining a difference between the DC current in the reference ring oscillator circuit and the DC current in the array test ring oscillator circuit by a resistance determination module; and determining the resistance of the array of capacitive elements based on the difference between the DC current in the reference ring oscillator circuit and the DC current in the array test ring oscillator circuit.

In yet another aspect, a computer program product comprising a computer readable storage medium containing computer code that, when executed by a computer, implements a method for determination of a resistance of an array of capacitive elements, wherein the method includes determining a direct current (DC) current in a reference ring oscillator circuit, the reference ring oscillator circuit being loaded with low-loss capacitive elements; determining a DC current in an array test ring oscillator circuit, the array test ring oscillator circuit being loaded with the array of capacitive elements; determining a difference between the DC current in the reference ring oscillator circuit and the DC current in the array test ring oscillator circuit; and determining the resistance of the array of capacitive elements based on the difference between the DC current in the reference ring oscillator circuit and the DC current in the array test ring oscillator circuit.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of systems and methods for determining the series resistance of an array of capacitive elements are provided, with exemplary embodiments being discussed below in detail. A circuit including two ring oscillators allows measurement of the series resistance of an array of capacitive elements having only a single level of interconnect. The first ring oscillator circuit is a reference circuit, and is loaded with low-loss capacitors. The second ring oscillator circuit is an array test circuit, and loaded with the array of capacitive elements. The resistance of the array of capacitive elements perturbs the direct current (DC) current ($I_{dd}$) flowing to the array test ring oscillator circuit in a linear fashion, while the $I_{dd}$ of the reference ring oscillator circuit serves as the zero-resistance reference. The difference between the $I_{dd}$ of the reference ring oscillator circuit and the $I_{dd}$ of the array test ring oscillator circuit may be used to determine the series resistance of the array of capacitive elements. The relationship between perturbation in $I_{dd}$ to the resistance of the array of capacitive elements may be simulated in advance, and the inverters in the reference and array test ring oscillator circuits may be sized with respect to the capacitive elements in the array such that the difference between the $I_{dd}$ of the reference ring oscillator circuit and the $I_{dd}$ of the array test ring oscillator circuit falls with in a linear regime of the relationship to the resistance of the capacitive elements. The circuit, including the reference and array test ring oscillator circuits, may be used to measure the series resistance of deep-trench capacitors in a DRAM, and also to evaluate the drive current a capacitive memory element's field effect transistor (FET).

Figure 1:
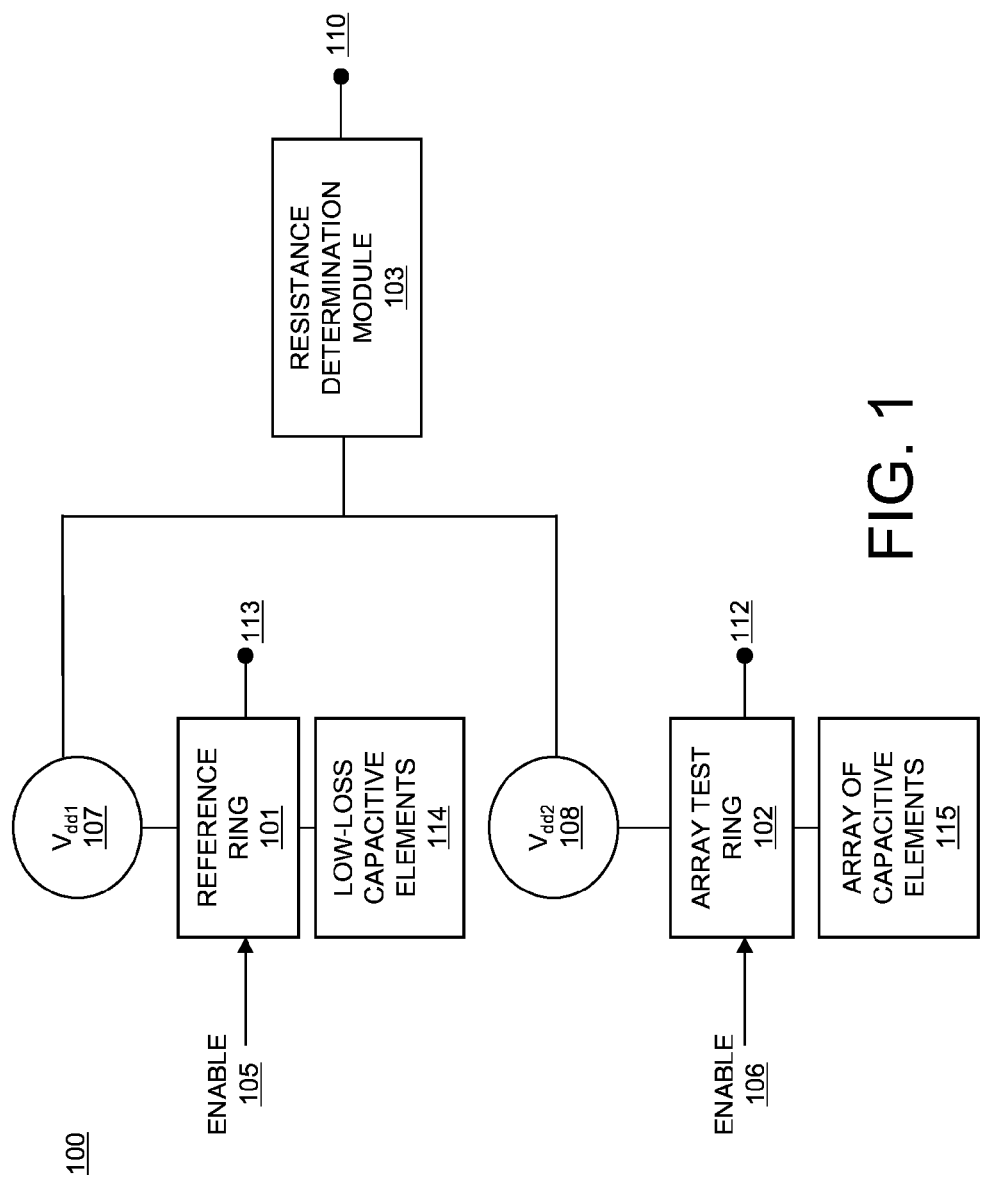
FIG. 1 is a schematic block diagram of an embodiment of a circuit for determination of the series resistance of an array of capacitive elements including a reference ring oscillator circuit and an array test ring oscillator circuit.

FIG. 1 shows an embodiment of a circuit 100 for determination of the series resistance of an array of capacitive elements including a reference ring oscillator circuit 101 and an array test ring oscillator circuit 102. Each of reference ring oscillator circuit 101 and an array test ring oscillator circuit 102 comprise a plurality of inverting stages, which are discussed in further detail below with respect to FIGS. 2 and 3, respectively. The reference ring oscillator circuit 101 is loaded with low-loss capacitive elements 114. The low-loss capacitive elements 114 included in reference ring oscillator circuit 101 may be metal-oxide-semiconductor field effect transistors (MOSFETs) in some embodiments. Reference ring oscillator circuit 101 receives an enable signal 105, has a frequency output 113, and a connection to a DC voltage node ($V_{dd1}$) 107. The voltage at $V_{dd1}$ node 107 is the amount of voltage present in the reference ring oscillator circuit 101; the DC current ($I_{dd1}$) present in reference ring oscillator circuit 101 may be determined from the $V_{dd1}$ node 107. The array test ring oscillator circuit 102 is loaded with the array of capacitive elements 115, which may comprise deep-trench capacitive memory elements in a memory array that are connected by a single interconnect level in some embodiments. Array test ring oscillator circuit 102 receives an enable signal 106, has a frequency output 112, and a connection to $V_{dd2}$ node 108; the DC current ($I_{dd2}$) present in array test ring oscillator circuit 102 may be determined from the $V_{dd2}$ node 108. Resistance determination module 103 receives data from $V_{dd1}$ node 107 and $V_{dd2}$ node 108 and uses this data to determine the resistance of the array of capacitive elements 115. Reference ring oscillator circuit 101 and array test ring oscillator circuit 102 may each comprise any appropriate number of inverting stages. For example, the array test ring oscillator circuit 102 may comprise two columns of two inverting stages each in some embodiments, with the array of capacitive elements 115 connected between the two columns.

Figure 2:
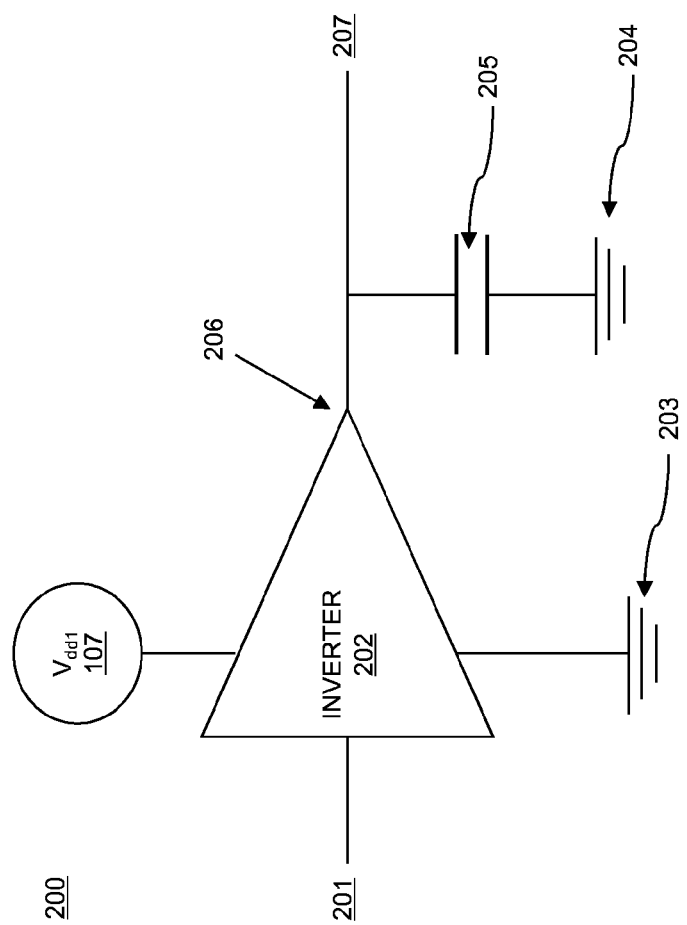
FIG. 2 is a schematic block diagram of an embodiment of an inverting stage of the reference ring oscillator circuit of FIG. 1.

FIG. 2 shows an embodiment of a reference inverting stage 200 of reference ring oscillator circuit 101. A reference ring oscillator circuit 101 may comprise any appropriate number of reference inverting stages 200 connected in series. Inverter input 201 may be connected to enable signal 105, or to a reference inverting stage output 207 of another reference inverting stage 200. Inverting stage output 207 may be the frequency output 113 of the reference ring oscillator circuit 101, or may be connected to the inverter input 201 of another reference inverting stage 200. The inverter 202 also has a ground connection 203 and a connection to $V_{dd1}$ node 107. Low-loss capacitance 205 corresponds to low-loss capacitive elements 114, and is connected to a node located between the inverter output 206 of the inverter 202 and the reference inverting stage output 207, and a ground connection 204. In some embodiments, the low-loss capacitance 205 may be present in only one inverting stage 200 of the plurality of inverting stages that make up the reference ring oscillator circuit 101.

Figure 3:
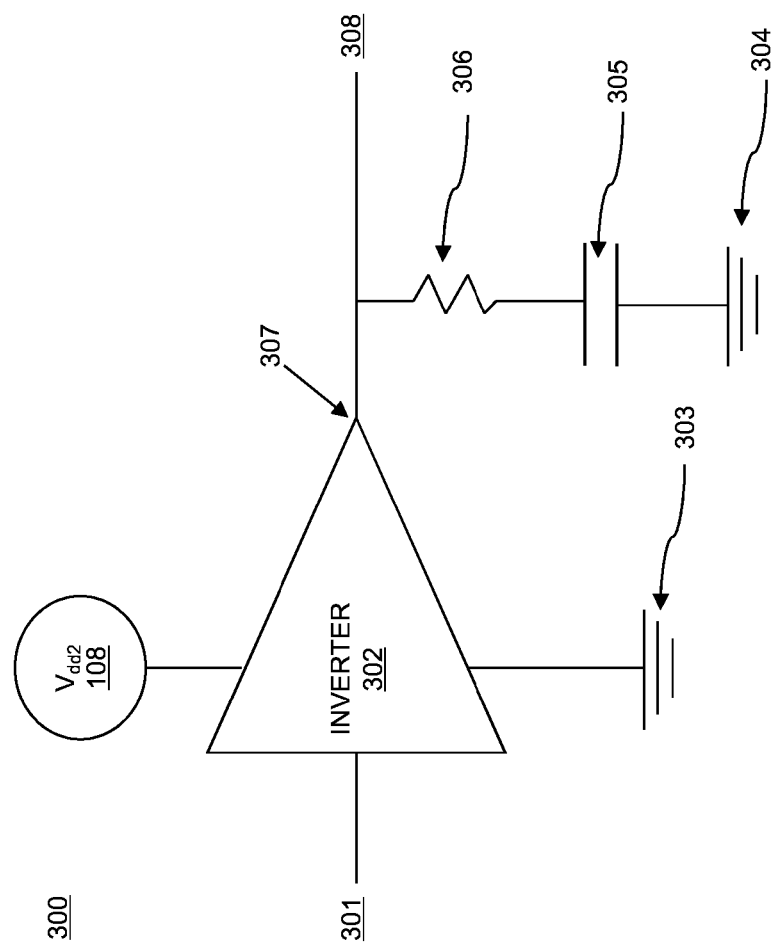
FIG. 3 is a schematic block diagram of an embodiment of an inverting stage of the array test ring oscillator circuit of FIG. 1.

FIG. 3 shows an embodiment of an array test inverting stage 300 of array test ring oscillator circuit 102. An array test ring oscillator circuit 102 may comprise any appropriate number of array test inverting stages 300 connected in series. Inverter input 301 may be connected to enable signal 106, or to an array test inverting stage output 308 of another array test inverting stage 300. Inverting stage output 308 may be the frequency output 112 of the array test ring oscillator circuit 102, or may be connected to the inverter input 301 of another array test inverting stage 300. The inverter 302 also has a ground connection 303 and a connection to $V_{dd1}$ node 108. Capacitance 305 and resistance 306 correspond to the array of capacitive elements 115, which connected to a node located between the inverter output 307 of the inverter 302 and the array test inverting stage output 308, and a ground connection 204. In some embodiments, the capacitance 305 and resistance 306 correspond to the array of capacitive elements 115 may be present in only one inverting stage 300 of the plurality of inverting stages that make up the array test ring oscillator circuit 102. Resistance 306 causes a change in the current $I_{dd2}$ observed at $V_{dd2}$ node 108 of array test ring oscillator circuit 102 as compared to the current $I_{dd1}$ observed at $V_{dd1}$ node 107 in the reference ring oscillator circuit 101; this chance allows the resistance 306, which gives the resistance of the array of capacitive elements 115, to be determined.

Returning to FIG. 1, the DC current $I_{dd1}$ of the reference ring oscillator circuit 101 is determined at $V_{dd1}$ node 107. $I_{dd1}$ may be stated as a resistance $R_1$ of the reference ring oscillator circuit 101, i.e., $R_1 = V_{dd1}/(2 \times I_{dd1})$. $R_1$ includes the resistance of the plurality of reference inverting stages 200 that comprise the reference ring oscillator circuit 101. The DC current $I_{dd2}$ of the array test ring oscillator circuit 102 is determined at $V_{dd2}$ node 108. $I_{dd2}$ may be stated as a resistance $R_2$ of the array test ring oscillator circuit 102, i.e., $R_2 = V_{dd2}/(2 \times I_{dd2})$. $R_2$ also includes the resistance of the plurality of array test inverting stages 300 that comprise the array test ring oscillator circuit 102 in conjunction with the array of capacitive memory elements. The reference ring oscillator circuit 101 and the array test ring oscillator circuit 102 are sized such that the resistance of their respective pluralities of inverting stages is approximately equal, i.e., the reference ring oscillator circuit 101 and the array test ring oscillator circuit 102 may comprise the same number and type of inverters. Therefore, the resistance determination module 103 may determine the resistance $R_3$ of the array of capacitive elements (which is represented by resistance 306 of FIG. 3) based on the difference between $R_1$ and $R_2$.

Figure 4:
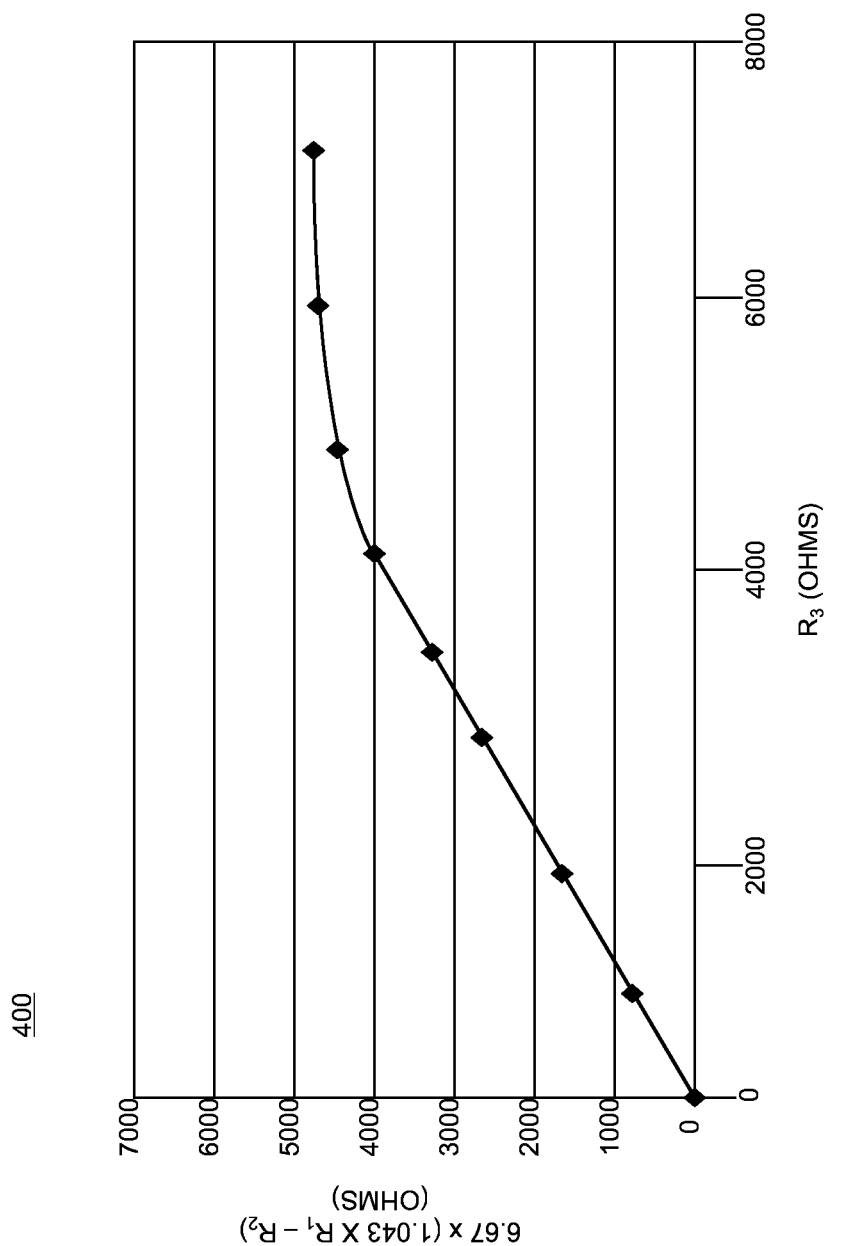
FIG. 4 is a graph illustrating a typical relationship between the difference between the resistances of the array test and reference ring oscillator circuits (R2 and R1, respectively) and the resistance of the array of capacitive elements (R3).

FIG. 4 is a graph 400 showing an example of a simulation of the relationship between $R_1-R_2$ (on the vertical axis) and the resistance of the array of capacitive elements $R_3$ (on the horizontal axis) for an example array of capacitive elements. Below a certain threshold, there is a linear response of $R_1-R_2$ to the resistance of the array of capacitive elements $R_3$. In the example graph 400, the linear regime threshold for $R_3$ is about 4000 ohms or less. In the linear regime of the curve, the resistance $R_3$ may be accurately determined. A graph such as graph 400 may be simulated for a particular array of capacitive elements before testing, and the reference and array test ring oscillator circuits may be designed so as to ensure that observed values of $R_1-R_2$ will fall in the linear regime. The curve shown in FIG. 4 is not sensitive to the capacitance of the array elements (represented by capacitance 305 of FIG. 3).

Figure 5:
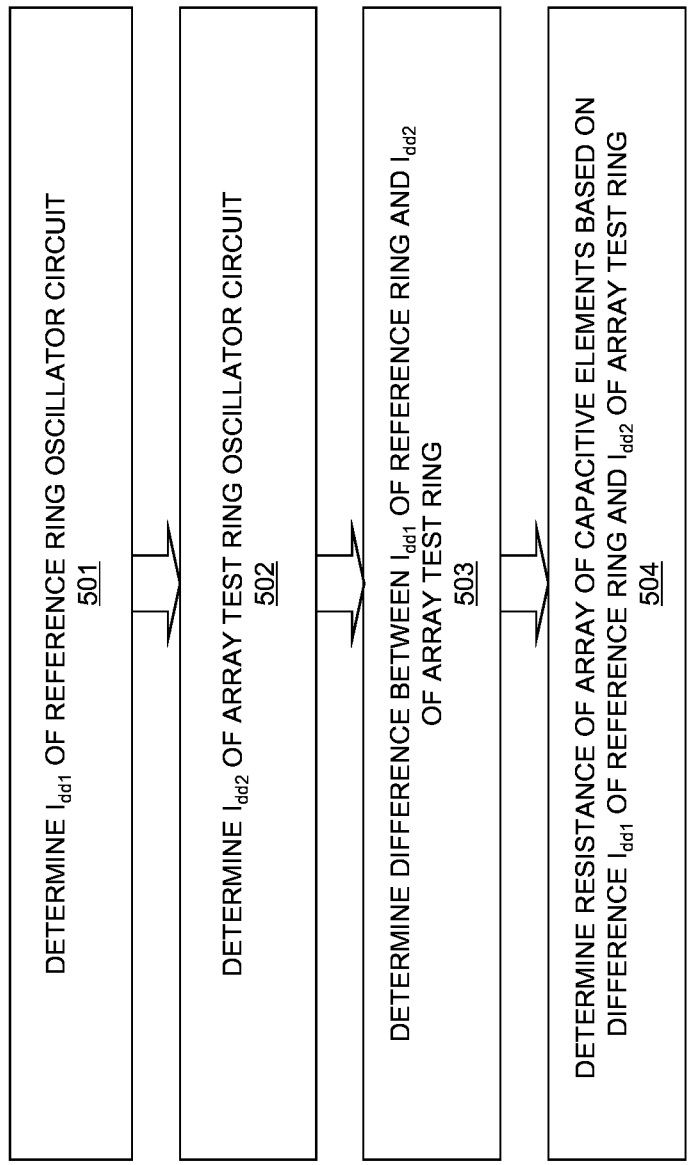
FIG. 5 is a flowchart of an embodiment of a method of determining the series resistance of an array of capacitive elements.

FIG. 5 shows a flowchart of an embodiment of a method 500 for determining the series resistance of an array of capacitive elements that is implemented in resistance determination module 103 of FIG. 1. In block 501, the resistance determination module 103 determines $I_{dd1}$ from $V_{dd1}$ node 107 of reference ring oscillator circuit 101. In block 502, the resistance determination module determines $I_{dd2}$ from $V_{dd2}$ node 108 of array test ring oscillator circuit 102. Then, in block 503, the resistance determination module 103 determines the difference between $I_{dd1}$ and $I_{dd2}$. This may be performed by expressing $I_{dd1}$ and $I_{dd2}$ as resistances $R_1$ and R2 and determining the difference between the resistances $R_1$ and $R_2$, as was discussed above. Lastly, once the difference is determined, the resistance $R_3$ of the array of capacitive elements 115 is determined based on the difference between difference between $I_{dd1}$ and $I_{dd2}$. This determination may be made based on a graph 400 such as was shown in FIG. 4; such a graph may be simulated for the particular type of array of capacitive elements being tested before performing method 500 of FIG. 5.

Figure 6:
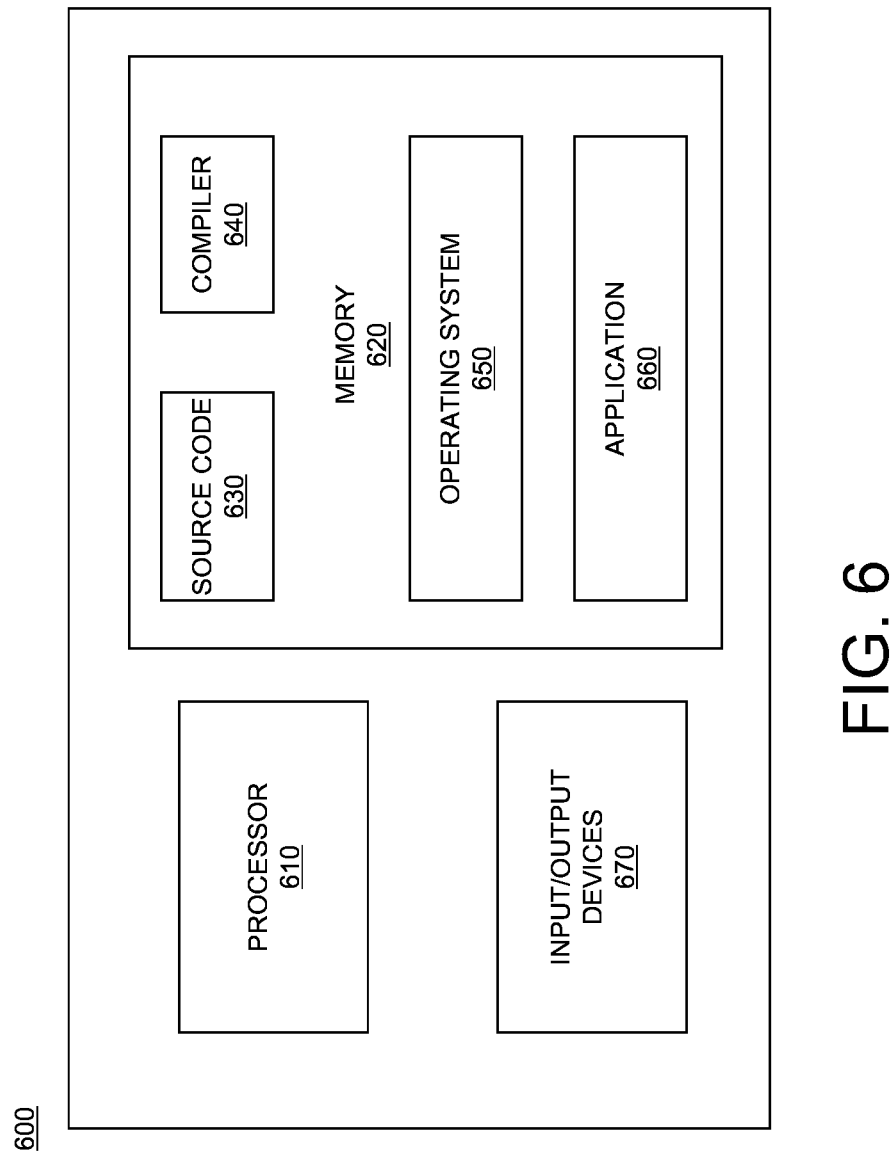
FIG. 6 is an embodiment of a computer that may be used in conjunction with a method of determining the series resistance of an array of capacitive elements.

FIG. 6 illustrates an example of a computer 600 which may be utilized by exemplary embodiments of a method for determining the series resistance of an array of capacitive elements as embodied in software. Various operations discussed above may utilize the capabilities of the computer 600. One or more of the capabilities of the computer 600 may be incorporated in any element, module, application, and/or component discussed herein.

The computer 600 includes, but is not limited to, PCs, workstations, laptops, PDAs, palm devices, servers, storages, and the like. Generally, in terms of hardware architecture, the computer 600 may include one or more processors 610, memory 620, and one or more input and/or output (I/O) devices 660 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 610 is a hardware device for executing software that can be stored in the memory 620. The processor 610 can be virtually any custom made or commercially available processor, a central processing unit (CPU), a digital signal processor (DSP), or an auxiliary processor among several processors associated with the computer 600, and the processor 610 may be a semiconductor based microprocessor (in the form of a microchip) or a macroprocessor.

The memory 620 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 620 may incorporate electronic, magnetic, optical, and/or other types of storage media. Note that the memory 620 can have a distributed architecture, where various components are situated remote from one another, but can be accessed by the processor 610.

The software in the memory 620 may include one or more separate programs, each of which comprises an ordered listing of executable instructions for implementing logical functions. The software in the memory 620 includes a suitable operating system (O/S) 650, compiler 640, source code 630, and one or more applications 660 in accordance with exemplary embodiments. As illustrated, the application 660 comprises numerous functional components for implementing the features and operations of the exemplary embodiments. The application 660 of the computer 600 may represent various applications, computational units, logic, functional units, processes, operations, virtual entities, and/or modules in accordance with exemplary embodiments, but the application 660 is not meant to be a limitation.

The operating system 650 controls the execution of other computer programs, and provides scheduling, input-output control, file and data management, memory management, and communication control and related services. It is contemplated by the inventors that the application 660 for implementing exemplary embodiments may be applicable on all commercially available operating systems.

Application 660 may be a source program, executable program (object code), script, or any other entity comprising a set of instructions to be performed. When a source program, then the program is usually translated via a compiler (such as the compiler 640), assembler, interpreter, or the like, which may or may not be included within the memory 620, so as to operate properly in connection with the O/S 650. Furthermore, the application 660 can be written as an object oriented programming language, which has classes of data and methods, or a procedure programming language, which has routines, subroutines, and/or functions, for example but not limited to, C, C++, C#, Pascal, BASIC, API calls, HTML, XHTML, XML, ASP scripts, FORTRAN, COBOL, Perl, Java, ADA, .NET, and the like.

The I/O devices 660 may include input devices such as, for example but not limited to, a mouse, keyboard, scanner, microphone, camera, etc. Furthermore, the I/O devices 660 may also include output devices, for example but not limited to a printer, display, etc. Finally, the I/O devices 660 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 660 also include components for communicating over various networks, such as the Internet or intranet.

If the computer 600 is a PC, workstation, intelligent device or the like, the software in the memory 620 may further include a basic input output system (BIOS) (omitted for simplicity). The BIOS is a set of essential software routines that initialize and test hardware at startup, start the O/S 650, and support the transfer of data among the hardware devices. The BIOS is stored in some type of read-only-memory, such as ROM, PROM, EPROM, EEPROM or the like, so that the BIOS can be executed when the computer 600 is activated.

When the computer 600 is in operation, the processor 610 is configured to execute software stored within the memory 620, to communicate data to and from the memory 620, and to generally control operations of the computer 600 pursuant to the software. The application 660 and the O/S 650 are read, in whole or in part, by the processor 610, perhaps buffered within the processor 610, and then executed.

When the application 660 is implemented in software it should be noted that the application 660 can be stored on virtually any computer readable medium for use by or in connection with any computer related system or method. In the context of this document, a computer readable medium may be an electronic, magnetic, optical, or other physical device or means that can contain or store a computer program for use by or in connection with a computer related system or method.

The application 660 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium.

More specific examples (a nonexhaustive list) of the computer-readable medium may include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical). Note that the computer-readable medium could even be paper or another suitable medium, upon which the program is printed or punched, as the program can be electronically captured, via for instance optical scanning of the paper or other medium, then compiled, interpreted or otherwise processed in a suitable manner if necessary, and then stored in a computer memory.

In exemplary embodiments, where the application 660 is implemented in hardware, the application 660 can be implemented with any one or a combination of the following technologies, which are well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The technical effects and benefits of exemplary embodiments include accurate determination of the series resistance of an array of capacitive elements.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A circuit for determination of a resistance of an array of capacitive elements, comprising:
   a reference ring oscillator circuit, the reference ring oscillator circuit being loaded with low-loss capacitive elements;
   an array test ring oscillator circuit, the array test ring oscillator circuit being loaded with the array of capacitive elements; and
   a resistance determination module, the resistance determination module configured to determine the resistance of the array of capacitive elements based on data from the reference ring oscillator circuit and the array test ring oscillator circuit;
   wherein the resistance determination module is configured to determine the resistance of the array of capacitive elements by:
   determining a direct current (DC) current in the reference ring oscillator circuit; determining a DC current in the array test ring oscillator circuit;
   determining a difference between the DC current in the reference ring oscillator circuit and the DC current in the array test ring oscillator circuit; and
   determining the resistance of the array of capacitive elements based on the difference between the DC current in the reference ring oscillator circuit and the DC current in the array test ring oscillator circuit.

2. The circuit of claim 1, wherein the array of capacitive elements comprise an array of deep-trench capacitors in a computer memory.

3. The circuit of claim 1, wherein the array of capacitive elements are connected by a single interconnect level.

4. The circuit of claim 1, wherein the reference ring oscillator circuit comprises a plurality of reference inverting stages connected in series, and wherein the array test ring oscillator circuit comprises a plurality of array test inverting stages connected in series.

5. The circuit of claim 4, wherein a reference inverting stage of the plurality of reference inverting stages comprises:
   an inverter, the inverter comprising a reference DC voltage connection, wherein the resistance determination module determines the DC current in the reference ring oscillator circuit from the reference DC voltage connection; and
   the low-loss capacitive elements connected between an output of the inverter and a ground connection.

6. The circuit of claim 4, wherein an array test inverting stage of the plurality of array test inverting stages comprises:
   an inverter, the inverter comprising an array test DC voltage connection, wherein the resistance determination module receives the DC current in the loaded ring oscillator circuit from the array test DC voltage connection; and
   the array of capacitive elements connected between an output of the inverter and a ground connection.

7. The circuit of claim 4, wherein the reference ring oscillator circuit and the array test ring oscillator circuit comprise the same number of inverting stages.

8. A method for determination of a resistance of an array of capacitive elements, the method comprising:
   determining a direct current (DC) current in a reference ring oscillator circuit, the reference ring oscillator circuit being loaded with low-loss capacitive elements;
   determining a DC current in an array test ring oscillator circuit, the array test ring oscillator circuit being loaded with the array of capacitive elements;
   determining a difference between the DC current in the reference ring oscillator circuit and the DC current in the array test ring oscillator circuit by a resistance determination module; and
   determining, by the resistance determination module, the resistance of the array of capacitive elements based on the difference between the DC current in the reference ring oscillator circuit and the DC current in the array test ring oscillator circuit.

9. The method of claim 8, further comprising simulating a graph of a relationship between the difference between the DC current in the reference ring oscillator circuit and the DC current in the array test ring oscillator circuit and the resistance of the array of capacitive elements before determining the resistance of the array of capacitive elements.

10. The method of claim 9, wherein the reference ring oscillator circuit and the array test ring oscillator circuit are sized such that the difference between the DC current in the reference ring oscillator circuit and the DC current in the array test ring oscillator circuit falls in a linear regime of the graph.

11. The method of claim 8, wherein the reference ring oscillator circuit comprises a plurality of reference inverting stages connected in series, and wherein the array test ring oscillator circuit comprises a plurality of array test inverting stages connected in series.

12. The method of claim 11, wherein a reference inverting stage of the plurality of reference inverting stages comprises:
    an inverter, the inverter comprising a reference DC voltage connection, wherein the resistance determination module determines the DC current in the reference ring oscillator circuit from the reference DC voltage connection; and
    the low-loss capacitive elements connected between an output of the inverter and a ground connection.

13. The method of claim 11, wherein an array test inverting stage of the plurality of array test inverting stages comprises:
    an inverter, the inverter comprising an array test DC voltage connection, wherein the resistance determination module receives the DC current in the loaded ring oscillator circuit from the array test DC voltage connection; and
    the array of capacitive elements connected between an output of the inverter and a ground connection.

14. The method of claim 11, wherein the reference ring oscillator circuit and the array test ring oscillator circuit comprise the same number of inverting stages.

15. A non-transitory computer readable storage medium containing computer code that, when executed by a computer, implements a method for determination of a resistance of an array of capacitive elements, wherein the method comprises:
    determining a direct current (DC) current in a reference ring oscillator circuit, the reference ring oscillator circuit being loaded with low-loss capacitive elements;
    determining a DC current in an array test ring oscillator circuit, the array test ring oscillator circuit being loaded with the array of capacitive elements;
    determining a difference between the DC current in the reference ring oscillator circuit and the DC current in the array test ring oscillator circuit; and
    determining the resistance of the array of capacitive elements based on the difference between the DC current in the reference ring oscillator circuit and the DC current in the array test ring oscillator circuit.

16. The computer program product according to claim 15, further comprising simulating a graph of a relationship between the difference between the DC current in the reference ring oscillator circuit and the DC current in the array test ring oscillator circuit and the resistance of the array of capacitive elements before determining the resistance of the array of capacitive elements.

17. The computer program product according to claim 16, wherein the reference ring oscillator circuit and the array test ring oscillator circuit are sized such that the difference between the DC current in the reference ring oscillator circuit and the DC current in the array test ring oscillator circuit falls in a linear regime of the graph.

18. The computer program product according to claim 15, wherein the reference ring oscillator circuit comprises a plurality of reference inverting stages connected in series, and wherein the array test ring oscillator circuit comprises a plurality of array test inverting stages connected in series.

19. The computer program product according to claim 18, wherein the reference ring oscillator circuit and the array test ring oscillator circuit comprise the same number of inverting stages.

* * * * *